(12) United States Patent
Nies

(10) Patent No.: US 6,391,828 B1
(45) Date of Patent: May 21, 2002

(54) CONSTRUCTION WITH HIGH $T_C$ SUPERCONDUCTOR MATERIAL AND PROCESS FOR PRODUCING THE CONSTRUCTION

(75) Inventor: Rainer Nies, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/564,671

(22) Filed: May 4, 2000

Related U.S. Application Data

(63) Continuation of application No. PCT/DE98/03107, filed on Oct. 22, 1998.

(30) Foreign Application Priority Data

Nov. 4, 1997 (DE) .......................................... 197 48 483

(51) Int. Cl.[7] .................................................. H01G 2/00
(52) U.S. Cl. ....................... 505/237; 505/330; 428/426
(58) Field of Search ................................ 505/237, 238, 505/239

(56) References Cited

FOREIGN PATENT DOCUMENTS

EP 0 300 499 1/1989
EP 0 312 015 B1 4/1989

OTHER PUBLICATIONS

Japanese Patent Abstract No. 01244677 (Minoru), dated Sep. 29, 1989.
"Deutsche Norm, Oberflächenrauheit, DIN 4762" dated Jan. 1989, pp. 2–16, pertains to the International Norm ISO 4287/1 concerning surface roughness.
"Vorgespanntes Glas BGG–11, Produktinformation", Schott Glaswerke, dated Mar. 1993, 2 pages, pertains to prestressed Glass BGG–11.
"Fabrication of biaxially aligned $Yba_2 Cu_3 O_{7-x}$ thin films on glass substrates", (Chen et al.), dated 1996, Physica C 267, pp. 355–360.

Primary Examiner—Deborah Jones
Assistant Examiner—Gwendolyn Blackwell-Rudasill
(74) Attorney, Agent, or Firm—Laurence A. Greenberg; Werner H. Stemer; Gregory L. Mayback

(57) ABSTRACT

A superconductor structure is disclosed, comprising a composite body made of an electrically insulating substrate to which an intermediate layer is bonded, a buffer layer is deposited on the intermediate layer and a layer of a metal-oxide high $T_c$ superconductor material is deposited on the buffer layer. The intermediate layer comprises a glass material with a coefficient of thermal expansion greater than $6 \times 10^{-6}$ K$^{-1}$. To produce the structure, at least one deposition process is selected in which the maximum temperature is at most 150 K higher than the transformation temperature of the glass material.

26 Claims, 1 Drawing Sheet

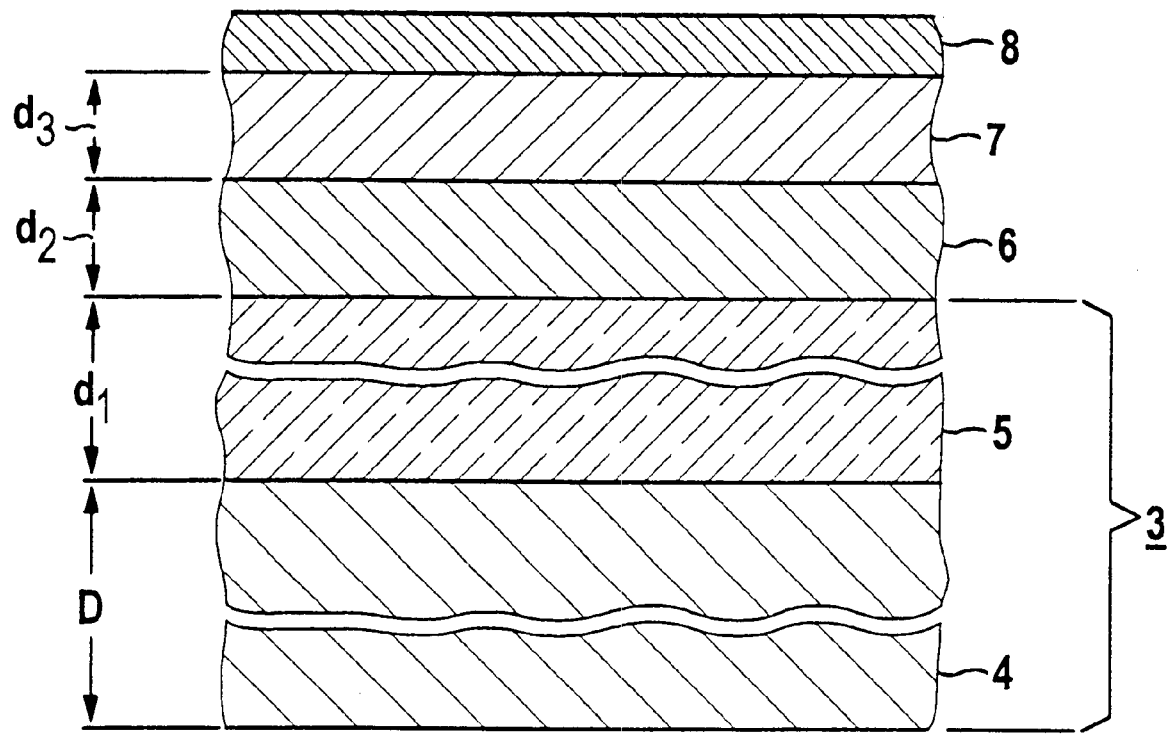

CONSTRUCTION WITH HIGH $T_C$ SUPERCONDUCTOR MATERIAL AND PROCESS FOR PRODUCING THE CONSTRUCTION

CROSS-REFERENCE TO RELATED APPLICATION

This is a continuation of copending International Application PCT/DE98/03107, filed Oct. 22, 1998, which designated the United States.

BACKGROUND OF THE INVENTION

Field of the Invention

The invention relates to a construction including a metal-oxide high $T_c$ superconductor material, whose parts include at least a substrate made from an electrically insulating material, the coefficient of thermal expansion of which is matched to that of the superconductor material, an intermediate layer arranged on the substrate, at least one buffer layer which has been deposited on the intermediate layer and a layer of the superconductor material which has been deposited on the buffer layer. The invention also relates to a process for producing a corresponding superconductor construction. A construction of this general type and a corresponding production process are to be found in European Patent Specification 0,312,015 B.

Superconductive metal oxide compounds with high critical temperatures $T_c$ above 77 K are known, and these compounds are therefore also known as high $T_c$ superconductor materials or HTS materials and, in particular, enable a liquid nitrogen (LN2) cooling technique to be used. Such metal oxide compounds include, in particular, cuprates of special material systems, for example of the Y—Ba—Cu—O or Bi—Sr—Ca—Cu—O types; the Bi component may be partially substituted by Pb. There may be a plurality of superconductive high $T_c$ phases within individual material systems, which phases differ through the number of copper-oxygen lattice planes or layers within the crystalline unit cell and have different critical temperatures.

It is desired for these known HTS materials to be deposited on different substrates for different applications, the aim generally being to form pure-phase superconductor material as far as possible. For example, metallic substrates are provided in particular for conductor applications.

Furthermore, the European specification mentioned above describes an oxidic superconductive shaped body with a substrate made from a polycrystalline metal or from ceramic, in which the substrate material is to have a coefficient of thermal expansion of between $5 \times 10^{-6}/° C.$ and $15 \times 10^{-6}/° C.$ If it is assumed that known HTS materials have coefficients of thermal expansion of the order of magnitude of approximately $10 \times 10^{-6}/° C.$, the expansion characteristic of the substrate is at least substantially matched to that of the HTS material. The substrate of the known shaped body is also covered with a layer of precious metal, for example of Au or Ag, which serves as a base for a buffer layer. This buffer layer consists of an inorganic material with a predetermined crystal structure and allows textured growth of the HTS material during a deposition process. Owing to the layer of precious metal on the substrate, the known shaped body cannot readily be used for a current limiter device. Since additional measures which reduce the switching capacity per unit surface area are required, for example in the form of a parallel connection of the precious metal layer with the HTS conductor, in order to prevent the current from sparking over from the HTS conductor via the buffer layer into the precious metal layer when an area of the HTS conductor becomes normally conductive.

Furthermore, German Specification 195 20 205 A describes the general use of electrically insulating substrates made from glass material as supports for conductor tracks made from HTS material in current limiter devices. To allow textured growth of the HTS material, in this case too a suitable buffer layer is applied to that surface of the substrate which is to be coated with the HTS material.

A further structure with a glass substrate as a support for an HTS layer is described in "Physica C", Vol. 267, 1996, pages 335 to 360. To produce a biaxially oriented thin film from the HTS material $YBa_2Cu_3O_{7-x}$, various glass substrates are selected from materials with a coefficient of thermal expansion α of at most $4.6 \times 10^{-6}/° C.$ Moreover, the substrates each had a very small surface area to be coated, which was covered with oriented, Y-stabilized $ZrO_2$. However, it has emerged that with the known construction it is only possible to achieve critical current densities $J_c$ of the order of magnitude of 104 A/cm$_2$ (in the zero field).

Current densities of this level are regarded as being too low for many applications.

SUMMARY OF THE INVENTION

It is accordingly an object of the invention is to provide a construction with high Tc superconductor material and a process for producing the construction that overcome the above-mentioned disadvantages of the prior art constructions and processes of this general type, in such a way that higher critical current densities can be achieved compared to the literature reference mentioned above. Industrial manufacture, in particular using commercially available glass material is to be possible, in order for it to be possible to use the construction in current limiter devices with a large surface area.

With the foregoing and other objects in view there is provided, according to the invention, a metal-oxide high $T_c$ superconductor material construction, comprising an electrically insulating material substrate having a coefficient of thermal expansion which is matched to that of the superconductor material, an intermediate layer bonded to the substrate so as to form a composite body with the substrate and comprising a glass material resistant to the maximum temperature occurring during the production of said construction and having a coefficient of thermal expansion greater than $6 \times 10^{-6}$ K$^{-1}$, at least one buffer layer which has been deposited on the intermediate layer, and a layer of metal-oxide superconductor material which has been deposited on the buffer layer.

The invention is based on the recognition that the (linear) thermal expansion coefficient of the glass material together with its characteristic transformation temperature, which is of importance with regard to the maximum temperature required for the deposition or formation of the superconductor material, is the decisive variable with a view to obtaining a high critical current density $J_c$. If a glass material having the claimed level of expansion coefficient is provided, it is advantageously possible to at least substantially avoid cracking in the HTS material, a phenomenon which was observed in the superconductor structure described in the abovementioned literature reference "Physica C", since this value is at least substantially matched to the value of the coefficient of expansion of the HTS material, which is of the order of magnitude of $10 \times 10^{-6}$ $K^{-1}$. A glass material with a coefficient of expansion of over $7 \times 10^{-6}$ $K^{-1}$ is therefore to be considered particularly advantageous. The measurement range for the abovementioned values usually extends from 20° C. to 300° C.

Surprisingly, it has been observed that certain commercially available glass materials intended for other applications, possibly also with a sufficiently large surface area, have a sufficiently high transformation temperature, in particular higher than 500° C., and also have the required high coefficient of expansion, even though commercially available glass materials with high coefficients of expansion generally do not have the required resistance to high temperatures such as those which are needed for the production of HTS materials.

Glass materials according to the invention which are suitable for the intermediate layer are relatively inexpensive, so that they can be used in particular for large-area substrates with a coatable area of at least 10 cm², preferably over 100 cm², as are to be provided in particular for current limiter devices according to the invention.

Specifically, in such devices a total surface area of HTS material of over 2 m² is required for a power of, for example, approximately 10 MVA which is to be limited.

The use of an intermediate layer made from the glass material makes it possible, in a simple manner, to obtain a sufficiently smooth coatable surface of the composite body comprising substrate and intermediate layer.

Complex and expensive polishing processes to be carried out on the surface can thus be avoided.

The intermediate layer of glass material according to the invention can be formed by a glaze deposited on the substrate; alternatively, a plate or pane made from a heat-resistant flat glass having appropriate coefficient of thermal expansion is joined to the substrate, in particular by adhesive bonding.

With the foregoing and other objects in view, there is also provided, according to this invention, a process for producing a construction according to this invention comprising the steps of providing an electrically insulating material substrate having a coefficient of thermal expansion which is matched to that of the superconductor material, bonding to the substrate an intermediate layer comprising a glass material resistant to the maximum temperature occurring during the production of the construction and having a coefficient of thermal expansion greater than $6 \times 10^{-6}$ $K^{-1}$, so as to form a composite body, depositing on the intermediate layer at least one buffer layer, and depositing on the at least one buffer layer a layer of metal-oxide superconductor material, wherein the maximum temperature on the substrate in at least one deposition process for the material of the buffer layer and/or the superconductor layer is held at most 150 K higher than the transformation temperature of the glass material.

Advantageously, the production of a construction according to the invention comprises a deposition process for the material of the buffer layer and/or the superconductor layer, in which the maximum temperature on the substrate is held preferably at most 100 K above the transformation temperature of the glass material. In this way, it is advantageously possible to avoid undesirable softening and expansion of the glass material, in particular when using intermediate layers with a large surface area.

Further advantageous configurations of the construction according to the invention and of the process for its production are given in the dependent claims.

Other features which are considered as characteristic for the invention are set forth in the appended claims.

Although the invention is illustrated and described herein as embodied in a construction with high $T_c$ superconductor material and process for producing the construction, it is nevertheless not intended to be limited to the details shown, since various modifications and structural changes can be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The only FIGURE diagramatically depicts a cross section through a superconductor construction according to the invention.

DESCRIPTION OF THE PREFERRED EMBODIMENTS

The superconductor construction according to the invention can be particularly advantageously used for devices in which large surface areas of preferably at least 10 cm², in particular at least 100 cm², are to be provided with an HTS material. One example of such a device is a short-circuit current limiter device with a planar conductor configuration, the basic design of which is generally known (cf. for example the abovementioned German specification 195 20 205 A or European specification 0,523,374 A). Current limiter devices of this nature in fact require surfaces of up to 200 cm². The use of special glass materials as a large-area base for an HTS material then enables the corresponding superconductor construction to be produced relatively easily and at low cost. Moreover, the glass material, together with the substrate consisting of electrically insulating material, ensures that the construction has a sufficient dielectric strength in particular as part of a current limiter device.

Part of a cross section through a conductor in such a short-circuit current limiter device can be seen in the FIGURE. The construction, which is denoted overall by 2, comprises a composite body 3 composed of a substrate 4 and a glass intermediate layer 5 bonded thereto. At least one buffer layer 6, which serves as a support for an HTS material layer 7, has been deposited on this intermediate layer. Where appropriate, the HTS layer 7 can be structured. Moreover, it can be covered with at least one further layer, such as a protective layer or a layer 8 which serves as a shunt resistor. A shunt resistor layer is particularly advantageous for current limiter applications.

A plate made of electrically insulating material of any desired thickness D and the required surface dimensions is used for the substrate 4. Furthermore, it is advantageous to select a substrate material whose linear thermal expansion coefficient α is matched to that of an HTS material selected for the superconductor structure 2. Since the known HTS materials generally have coefficients of thermal expansion a of the order of magnitude of approximately $10 \times 10^{-6}$ $K^{-1}$ over a standard measuring range of 20° C. to 300° C., it is advantageous to select a substrate material with a coefficient of thermal expansion α of at least $6 \times 10^{-6}$ $K^{-1}$, preferably at least $7 \times 10^{-6}$ $K^{-1}$. Suitable materials are therefore in particular ceramics in the form of oxides, borides, nitrides or silicides, for example glass ceramics. Mixed ceramics comprising at least two of the abovementioned types of ceramic can also be used. For example, for $Al_2O_3$, $\alpha$ is approximately $7.5 \times 10^{-6}$ $K^{-1}$, and for $ZrO2$, $\alpha$ is approximately $11 \times 10^{-6}$ $K^{-1}$. A glass ceramic produced by Corning GmbH, Wiesbaden, Germany, marketed under the trade name "Macor", has an $\alpha$ of approximately $9.3 \times 10^{-6}$ $K^{-1}$. Where the superconductor structure is used as part of a current limiter device, moreover, it is advantageous to select a material which has a comparatively high thermal conductivity $\lambda_{77K}$ (at 77 K) of at least 10 W/mK (Watts per meter×Kelvin), preferably at least 50 W/mK. In this case, $Al_2O_3$ is to be regarded as particularly suitable, since its $\lambda_{77K}$ is approximately 150 W/mK. Moreover, the substrate material should be sufficiently temperature-resistant to withstand not only temperatures which occur during deposition and formation of the superconductor material, but also to withstand without damage even the high temperatures of generally above 1000°C. which are required for any coating with a glaze of the glass material.

To form the composite body 3, then, a large-area flat side of the substrate 4 is provided with an intermediate layer 5 made from a special glass material having a thickness $d_1$. Owing to the relatively low thermal conductivity of the glass material, in cases where good heat transfer to the substrate is important, as for example in the case of a current limiter device, a small thickness $d_1$ of preferably at most 0.5 mm is provided. To coat the substrate surface of the substrate, the latter may be covered with a glaze of melted glass material using glazing processes which are known per se. Alternatively, however, it is also possible to use a thin pane of an appropriate flat glass, for example with a thickness of 500 μm, which is then attached to the substrate surface, in particular by adhesive bonding. Particularly suitable adhesives are those which do not release any substances when the substrate is heated during the deposition of the buffer layer material and the HTS material. Therefore, known ceramic-based adhesives are advantageous. The flat glass pane can preferably be drawn from the melt and, if appropriate, then thermally smoothed. Thermal smoothing removes slight undulations and other unevenness by heating the surface. The fused surface of the two abovementioned embodiments of the intermediate layer 5 then exhibits micro-roughness which is sufficiently small for the subsequent coating operations. The surface roughness, defined by the maximum surface roughness $R_t$, should advantageously be below 50 nm, preferably below 20 nm, based on a measurement section of 500 μm. In the present context, the variable $R_t$ is understood as meaning the distance within the intended section between an upper boundary which touches the surface profile at its highest elevation and a parallel lower boundary which touches the surface profile at its lowest valley (cf. also 1978 version of DIN 4762). Greater undulation of the surface in the millimeter range does not generally present problems.

According to the invention, the material selected for the intermediate layer 5 should be a glass material which, on the one hand, has a sufficiently high transformation temperature with regard to the maximum temperature (on the substrate) occurring in the subsequent deposition processors. The transformation temperature should be at most 150° C. below this maximum temperature. On the other hand, the glass material should have a linear thermal expansion coefficient $\alpha$ in a standard temperature range from 20° to 300° C. which is greater than $6 \times 10^{-6}$ $K^{-1}$ and in particular is at least $7 \times 10^{-6}$ $K^{-1}$. Surprisingly, these requirements are fulfilled, for example, by an aluminosilicate glass produced by "Deutsche Spezialglas AG", Grunenplan, Germany under the product name "SG-11" (previous product name "BGG-11" produced by "Schott Glaswerke", Mainz, Germany, 1983). This glass, which belongs to the safety glass category and is used, for example, in the aerospace and aeronautical industries, in the lighting and window industry, and for spectacles and watch glass materials and for substrates for photomasks, has a coefficient of thermal expansion $\alpha$ of $8.9 \times 10^{-6}$ $K^{-1}$ with a deformation temperature of 870° C. and a transformation temperature of 607° C. It has been recognized that this glass material can be used to particularly good effect as an intermediate layer material in the superconductor construction according to the invention.

To enable the required textured, in particular epitaxial growth of the HTS material to take place, as is required for a high critical current density $J_c$ of the HTS material, the at least one buffer layer must consist of a material which ensures such growth. Therefore, a layer 6 with a texture which is matched to the crystalline dimensions of the HTS material is particularly suitable. Biaxially textured, yttrium-stabilized zirconium oxide (abbreviation: "YSZ") is advantageous. In addition, other known buffer layer materials, such as $CeO_2$, $YSZ+CeO_2$ (as a double layer), $Pr_6O_{11}$, MgO, YSZ+tin-doped $In_2O_3$ (as a double layer), $SrTiO_3$ or $La_{1-x}Ca_xMnO_3$ are also suitable. One or more of these materials is deposited in a manner known per se on the surface of the intermediate layer 5. For this purpose, it is advantageously possible to use a so-called IBAD (Ion Beam Assisted Deposition) process. Naturally, other processes are also suitable, for example sputtering or laser ablation at a predetermined angle. In most cases, the buffer layer material is deposited at temperatures on the substrate or on the composite body which are below the maximum temperature which occurs during the production of the superconductor material. The maximum temperature for the buffer layer deposition should exceed the transformation temperature of the glass material by at most 150° C., preferably by at most 100° C. The layer thickness d2 of the textured buffer layer 6 produced in this way is generally between 0.01 and 2 μm.

Then, the HTS material is applied to the buffer layer 6 with the aid of known deposition processes, with the substrate being heated, in a thickness $d_3$ of generally up to a few micrometers. Advantageously, the process selected requires a maximum temperature for deposition and formation of the HTS material which is at most 150° C. higher, preferably at most 100° C. higher, than the transformation temperature of the glass material selected. The most common suitable PVD (Physical vapor Deposition) processes are laser ablation using pulsed lasers, magnetron sputtering or preferably thermal coevaporation (=simultaneous evaporation of the individual components of the HTS material while oxygen is being supplied). The latter process can advantageously be carried out at relatively low substrate temperatures of approximately 650° C. CVD (Chemical Vapor Deposition) processes, in particular using organometallic starting materials, are also suitable.

Suitable HTS materials are all known metal oxide high $T_c$ superconductor materials, such as in particular $YBa_2Cu_3O_{7-x}$ or $RBa_2Cu_3O_{7-x}$ (where R=rare earth metal), $TlBa_2Ca_2Cu_3O_{9+x}$, $HgBa_2CaCu_2O_{6+x}$, $Bi_2Sr_2CaCu_2O_{8-x}$ or $(Bi,Pb)2Cr2Ca2Cu3O11-x$.

According to one concrete exemplary embodiment for the production of a plate conductor for a current limiter device using a superconductor construction 2 according to the invention, an $Al_2O_3$ plate with a thickness of approximately 2 mm and a surface area of $10 \times 10$ cm$^2$ was provided, at a sufficiently high temperature, with a glaze of the known alumino silicate glass with the product name "SG-11". The thickness $d_1$ of the intermediate layer formed in this way was about 0.2 mm. Next, a biaxially textured buffer layer 6 made of YSZ with a thickness $d_2$ of approximately 1 μm was applied to the smooth glass surface by means of an IBAD process. Then, an HTS layer 7 made of $YBa_2Cu_3O_{7-x}$ with a thickness $d_3$ of approximately 1 μm was deposited on the substrate surface which had been coated in this way. A thermal coevaporation of the components of the material while oxygen was being supplied, at a substrate temperature of 620° to 650° C., by means of a known coating apparatus was used for this purpose. Subsequently, the HTS layer 7 was coated with an Au shunt resistor layer 8 with a thickness of 0.5 mm. The HTS layer of the structure 2 then had a critical current density $J_c$ (in the zero field, at 77 K, with 0.1 μV/cm as characteristic of the critical current $I_c$) of over $5 \times 10^5$ A/cm².

I claim:

1. A metal-oxide high $T_c$ superconductor material construction, comprising an electrically insulating material substrate having a coefficient of thermal expansion which is matched to that of the superconductor material, an intermediate layer bonded to the substrate and comprising a glass material resistant to the maximum temperature occurring during the production of said structure and having a coefficient of thermal expansion greater than $6 \times 10^{-6}$ K$^{-1}$, said intermediate layer being of a material different than that of said insulating material substrate, at least one buffer layer which has been deposited on the intermediate layer, and a layer of metal-oxide superconductor material which has been deposited on the buffer layer.

2. The construction according to claim 1, wherein the glass material has a coefficient of thermal expansion greater than $7 \times 10^{-6}$ K$^{-1}$.

3. The construction according to claim 1, wherein the glass material has a transformation temperature of at least 500° C.

4. The construction according to claim 1, wherein the intermediate layer has a coatable surface area of at least 10 cm².

5. The construction according to claim 1, wherein the intermediate layer has a coatable surface area of at least 100 cm².

6. The construction according to claim 1, wherein the intermediate layer has a thickness not exceeding 0.5 mm.

7. The construction according to claim 1, wherein the intermediate layer has the form of a glaze on the substrate.

8. The construction according to claim 1, wherein the intermediate layer is made from a flat glass.

9. The construction according to claim 8, wherein said flat glass has been thermally smoothed.

10. The construction according to claim 1, wherein the intermediate layer is adhesively bonded to the substrate.

11. The construction according to claim 10, wherein the intermediate layer is adhesively bonded to the substrate with a ceramic-based adhesive.

12. The construction according to claim 1, wherein the substrate has a coefficient of thermal expansion greater than $6 \times 10^{-6}$ K$^{-1}$.

13. The construction according to claim 1, wherein the substrate has a coefficient of thermal expansion greater than $7 \times 10^{-6}$ K$^{-1}$.

14. The construction according to claim 1, wherein the substrate comprises a ceramic material.

15. The construction according to claim 14, wherein said ceramic material is selected from the group consisting of an oxide ceramic, a carbide ceramic, a boride ceramic, a nitride ceramic, a silicide ceramic, and mixtures thereof.

16. The construction according to claim 14, wherein said ceramic material is selected from the group consisting of $Al_2O_3$ ceramic, $ZrO_2$ ceramic, and mixtures thereof.

17. The construction according to claim 1, wherein a buffer layer has a texture matched to the crystalline dimensions of the super conductor material.

18. The construction according to claim 17, wherein a buffer layer is made of biaxially textured, yttrium-stabilized zirconium oxide.

19. A current limiter device comprising a construction according to claim 1.

20. A process for producing a metal-oxide high $T_c$ superconductor material construction according to claim 1, comprising the steps of providing an electrically insulating material substrate having a coefficient of thermal expansion which is matched to that of the superconductor material, bonding to the substrate an intermediate layer comprising a glass material resistant to the maximum temperature occurring during the production of said structure and having a coefficient of thermal expansion greater than $6 \times 10^{-6}$ K$^{-1}$, so as to form a composite body, depositing on the intermediate layer at least one buffer layer, and depositing on the at least one buffer layer a layer of metal-oxide superconductor material, wherein the maximum temperature on the substrate in at least one deposition process for the material of the buffer layer and/or the superconductor layer is held at most 150 K higher than the transformation temperature of the glass material.

21. The process of claim 20, wherein the maximum temperature on the substrate in at least one deposition process for the material of the buffer layer and/or the superconductor layer is held at most 100 K higher than the transformation temperature of the glass material.

22. The process of claim 20, wherein the deposition process for the superconductor material is a simultaneous thermal vapor deposition of the individual components of the superconductor material while oxygen is being supplied, a laser ablation process, a sputtering process, or a chemical vapor deposition process.

23. The process of claim 22, wherein the deposition process for the superconductor material is a chemical vapor deposition process with organometallic components of the superconductor material for the superconductor material.

24. The process of claim 20, wherein a screen-printing process is provided for deposition of the superconductor material.

25. The process of claim 20, wherein an ion beam assisted deposition (IBAD), a sputtering process or a laser ablation process is provided for deposition of the buffer layer material.

26. The process of claim 20, wherein the composite body is produced first, before the at least one buffer layer and the superconductor layer are deposited.

* * * * *